(12) United States Patent
Leslie

(10) Patent No.: US 8,301,473 B2
(45) Date of Patent: Oct. 30, 2012

(54) STOWAGE AND CENTER OF GRAVITY VERIFICATION AND ASSESSMENT TOOL

(75) Inventor: Christopher E. Leslie, Friendswood, TX (US)

(73) Assignee: United Space Alliance, LLC, Cape Canaveral, FL (US)

( * ) Notice: Subject to any disclaimer, the term of this patent is extended or adjusted under 35 U.S.C. 154(b) by 1422 days.

(21) Appl. No.: 12/040,525

(22) Filed: Feb. 29, 2008

(65) Prior Publication Data

US 2012/0253651 A1    Oct. 4, 2012

Related U.S. Application Data

(60) Provisional application No. 60/910,538, filed on Apr. 6, 2007.

(51) Int. Cl.
*G06Q 10/00*    (2012.01)
(52) U.S. Cl. .................................... 705/7.11; 705/7.23
(58) Field of Classification Search ................. 705/7.11, 705/7.23
See application file for complete search history.

(56) References Cited

U.S. PATENT DOCUMENTS

| | | | |
|---|---|---|---|
| 4,161,876 A * | 7/1979 | Carpenter ..................... | 73/65.08 |
| 4,549,267 A * | 10/1985 | Drabouski, Jr. ............... | 701/124 |
| 5,081,865 A * | 1/1992 | Schechter et al. ........... | 73/65.07 |
| 5,606,695 A | 2/1997 | Dworzecki | |
| 5,951,609 A | 9/1999 | Hanson et al. | |
| 6,133,872 A | 10/2000 | Mitchell et al. | |
| 6,216,106 B1 | 4/2001 | John | |
| 6,216,109 B1 | 4/2001 | Zweben et al. | |
| 6,490,566 B1 | 12/2002 | Schmidt | |
| 6,795,758 B2 | 9/2004 | Sinex | |
| 7,003,475 B1 | 2/2006 | Friedland et al. | |
| 7,006,903 B2 | 2/2006 | Smith et al. | |
| 7,110,915 B2 * | 9/2006 | Wilson ......................... | 702/181 |
| 7,283,975 B2 | 10/2007 | Broughton | |
| 7,295,719 B2 | 11/2007 | Robertson et al. | |
| 2003/0047387 A1 * | 3/2003 | Bogat ............................ | 186/59 |
| 2004/0162811 A1 | 8/2004 | Wetzer et al. | |
| 2006/0060695 A1 * | 3/2006 | Walden et al. ................. | 244/24 |

(Continued)

FOREIGN PATENT DOCUMENTS

EP    1641218 A1    3/2006

(Continued)

OTHER PUBLICATIONS

Refanidis et al., ICAPS 2005 System Demonstrations, Monterey, California.

(Continued)

*Primary Examiner* — Thomas L. Mansfield, Jr.
(74) *Attorney, Agent, or Firm* — Greenberg Traurig LLP (57) ABSTRACT

A stowage and center of gravity verification and assessment tool which assists users in locating items within an environment, determining the center of gravity of the environment, and calculating item location changes that facilitate altering the center of gravity. Each item to be tracked within the environment is equipped with one or more remotely pollable identifiers, such as, without limitation, barcodes, or RFID or ultrasonic tags, and the system stores the mass of each item. As items are moved in the environment, the system tracks the impact of such movement on the environment's center of gravity and recommends item location changes. The system can also assist users in locating items within the environment, provide access to detailed information about individual items, and assist with task scheduling.

23 Claims, 6 Drawing Sheets

U.S. PATENT DOCUMENTS

| | | |
|---|---|---|
| 2006/0136103 A1 | 6/2006 | Lee et al. |
| 2007/0021998 A1 | 1/2007 | Laithwaite et al. |
| 2007/0050225 A1 | 3/2007 | Leslie |
| 2008/0017759 A1 | 1/2008 | Fussell et al. |
| 2009/0152391 A1* | 6/2009 | McWhirk ................ 244/30 |

FOREIGN PATENT DOCUMENTS

| | | |
|---|---|---|
| WO | WO2007025220 A3 | 3/2007 |

OTHER PUBLICATIONS

Hadjitheodosiou et al., "Flexible access for a space communications network with IP functionality," Elsevier B.V., 1389-1286, 2004.

Chien et al., "Automating Planning and Scheduling of Shuttle Payload Operations," Jet Propulsion Laboratory, California Institute of Technology, 1998.

Hagopian et al., "Explicit and Implicit Resources: A Simplified Approach to User Requirements Modeling," National Aeronautics and Space Administration, Paper ID No. SO96.3.8, 1996.

"ICAPS 2005, System Demonstration," http://icaps05.uni-ulm.de/documents/proceedings/sd-allpapers.pdf, by Ioannis Refanidis, University of Macedonia, Greece.

Notice of Intent to Propose (to NASA) by United Space Alliance, LLC, Apr. 2004.

Autonomy and Operations: Implementation Scenarios, by Cindy M. Kurt of United Space Alliance, LLC.

Firschein et al., "Artificial Intelligence for Space Station Automation—Crew Safety, Productivity, Autonomy, Augmented Capability," Noyes Publications, 1986.

"STK/Scheduler," Orbit Logic Incorporated; http://www.orbitlogic.com/products/stkscheduler.php; pp. 1-5.

"Satellite Tool Kit Scheduler," http://www.orbitlogic.com/support/Scheduler/frame.htm; 4 pgs.

"STK/Scheduler Tutorial," STK/Scheduler v8.0; http://www.orbitlogic.com/products/STKscheduler_Tutorial.pdf; pp. 1-43.

"The Optwise Corporation Deconfliction Scheduler Algorithms (As used in STK/Scheduler)," Optwise Corporations, http://www.orbitlogic.com/products/Optwise%20Alog%20in%20STK%20Scheduler.pdf; pp. 1-18, Jul. 15, 2004.

"Collection Planning Solutions from Orbit Logic: Key Aspects," Orbit Logic Incorporated, http://www.orbitlogic.com/products/cps.php; pp. 1-2.

* cited by examiner

STOWAGE AND CENTER OF GRAVITY VERIFICATION AND ASSESSMENT TOOL

This application claims priority from U.S. Provisional Patent Application Ser. No. 60/910,538, filed Apr. 6, 2007, which is hereby incorporated by reference in its entirety.

This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The instant disclosure relates to the field of asset management, and more specifically provides a system and method through which the location of various assets can be tracked, and which can assist in assessing and reconfiguring the center of gravity of a vehicle based on such tracking information.

BACKGROUND

Despite the relatively confined spaces associated with closed environments, such as, without limitation, marine vessels and spacecraft, the persons working in such environments still have difficulty tracking the location of a variety of items, including tools, equipment, supplies, and the like. While losing or misplacing an item is frustrating in a traditional, open environment, such items can typically be replaced with relative ease. In a closed environment, however, the misplaced items frequently cannot be replaced, and even in those cases where the item can be replaced, the cost of replacing the items in a relatively short time can be astronomical.

Another problem with misplaced, lost, or relocated items is the impact such items have on the center of gravity of the closed environment. Knowledge of the vehicle's center of gravity can significantly aid in predicting the result of various actions on the environment, such as, without limitation, the impact an acceleration will have on the a corresponding vehicle's trajectory. By way of example, if the cargo onboard a ship is weighted to one side, the ship will tend to pull to that side as it is propelled and/or accelerated. Similarly, if the cargo is weighted too far astern, the force generated by the ship's propulsion system will not be parallel with the water's surface, thereby creating inefficiencies which are exacerbated over a lengthy voyage.

SUMMARY

By monitoring the location of various items, it is possible to both help the occupants of the closed environment work more efficiently and, where the closed environment is a vehicle, for the vehicle to be operated more efficiently. Accordingly, the instant disclosure is directed to a stowage and center of gravity assessment tool that substantially obviates one or more of the problems due to limitations and disadvantages of the related art.

Additional features and advantages will be set forth in the description which follows, and in part will be apparent from this disclosure, or may be learned by practice thereof. The objectives and other advantages will be realized and attained by the structure particularly pointed out in this written description, including any claims contained herein and the appended drawings.

Traditionally, items are assigned designated storage locations based on their purpose, the type of item, or some other criteria. When the item is needed, however, it can be moved throughout the environment. Although items are usually returned to their designated storage location, emergencies, accidents, and other such distractions can cause an item to be misplaced, put in an incorrect storage location, etc. By outfitting items with remotely pollable identification tags and positioning polling means throughout the environment, the location of the item can be easily determined. Still further, when the item location information is tracked by computer, the computer can permit users to view a graphical representation of the item location, such as, without limitation, in a three-dimensional model of the environment, on two-dimensional map of the environment or a portion of the environment, or the like. The user can also obtain information about the item, including, without limitation, usage instructions; maintenance and repair procedures; the location of parts and/or supplies; a listing of all tasks that utilize the item; a listing of upcoming, scheduled tasks that utilize the item; and the like. Computerized item tracking can also facilitate center of gravity calculation for the environment when the item information also includes an indication of the item's mass. The instant stowage and center of gravity assessment tool can provide these and other features.

It is to be understood that both the foregoing general description and the following detailed description are exemplary and explanatory and are intended to provide further explanation of the disclosed stowage and center of gravity assessment tool.

BRIEF DESCRIPTION OF THE DRAWINGS

The accompanying drawings, which are included to provide a further understanding of the disclosed stowage and center of gravity assessment tool and are incorporated in and constitute a part of this specification, illustrate various embodiments and, together with the description, serve to explain the principles of at least one embodiment of the disclosed stowage and center of gravity assessment tool.

In the drawings.

DETAILED DESCRIPTION

Reference will now be made in detail to embodiments of the disclosed stowage and center of gravity assessment tool, examples of which are illustrated in the accompanying drawings.

In an embodiment, the disclosed stowage and center of gravity assessment tool comprises the application or embedding of (generally referred to herein as associating) remotely pollable identifiers into each item whose location is to be tracked. Such remotely pollable identifiers may include, but are not limited to, optically scanable identifiers, such as bar codes or other machine-readable codes imprinted on the surface of an item; radio frequency identifiers, such as radio frequency identification tags embedded in or attached to an item; and ultrasonic identifiers, such as ultrasonic tags, embedded in or attached to the surface of an item. By way of example, without limitation, ultrasonic or radio frequency identification tags may be embedded in an item when the item is manufactured, or the tags may take the form of labels that are adhered to the surface of the item. Similarly, barcodes may be printed on labels and adhered to the surface of the item, or may be etched, engraved, or otherwise embedded in the surface of the item.

An appropriate identifier type may be chosen for a given item based on the item's anticipated usage, attributes of the environment, and the like. In some embodiments, multiple identifiers are associated with an item, thereby permitting the item to be seamlessly moved from an environment employing one identifier type to another embodiment employing a different identifier type, and permitting redundancy. By way of example, without limitation, in environments, or portions of an environment, comprising sensitive electronic equipment, radio frequency identifiers may cause problems with the electronic equipment, and optical identifiers may be impractical due to the line-of-sight requirements associated with such identifiers. Such environments may be configured to read an ultrasonic tag embedded in or applied to an item. Although ultrasonic identifiers do not interfere with electronics the way radio frequency identifiers do, ultrasonic identifiers require a physical medium through which the ultrasonic waves can propagate. Radio frequency identifiers are also less expensive than current ultrasonic identifiers. Thus, radio frequency identifiers may be associated with most or all items in the environment, and ultrasonic, optical, or other remotely pollable identifiers may be associated with those items which are likely to be used in environments in which radio frequency identifiers are disadvantageous.

Figure 1:
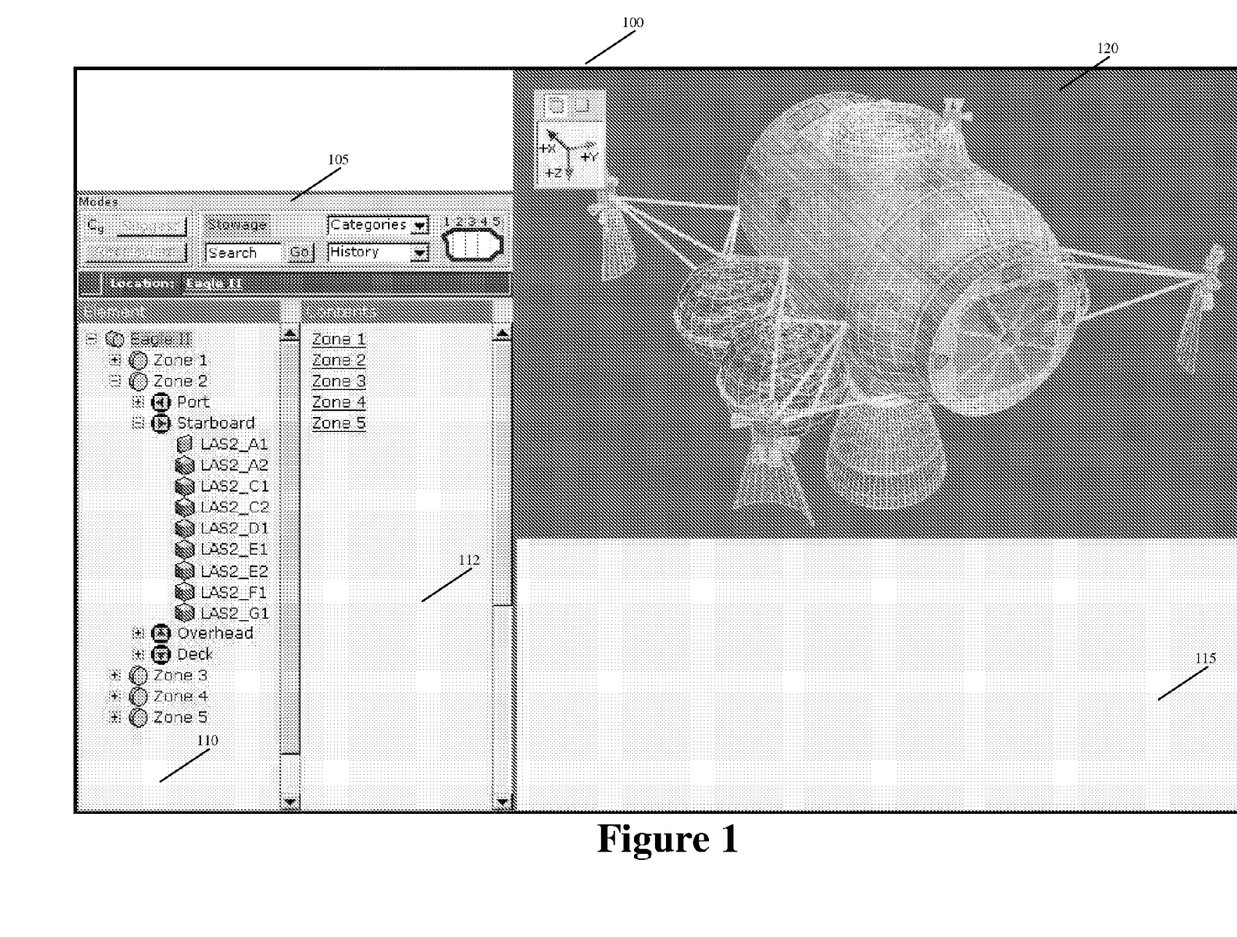
FIG. 1 is a screen capture of an exemplary user interface through which a user can identify a region of the environment to be explored.

FIG. 1 is a screen capture of an exemplary user interface 100 through which a user can identify a region of the environment whose items are to be explored. In the illustrated embodiment, user interface 100 is divided into four general regions, dashboard 105, zone 110, information pane 115, and environment view 120. Dashboard 105 allows the user to easily control the manner in which item information is presented within zone 110. In the illustrated embodiment, the user has opted to have the items arranged in hierarchical categories based on the zone, or region, of the environment in which the item is located. As the user navigates to a particular branch of the hierarchical list in zone 110, the leaves and/or sub-branches of that branch are displayed in contents 112.

Environment view 120 provides a graphical view of the branch or leaf selected by the user in zone 110 and/or contents 112. By way of example, without limitation, because the user has only selected the top-most branch of the hierarchy in FIG. 1, environment view 120 displays the entirety of the Eagle II vehicle.

Figure 2:
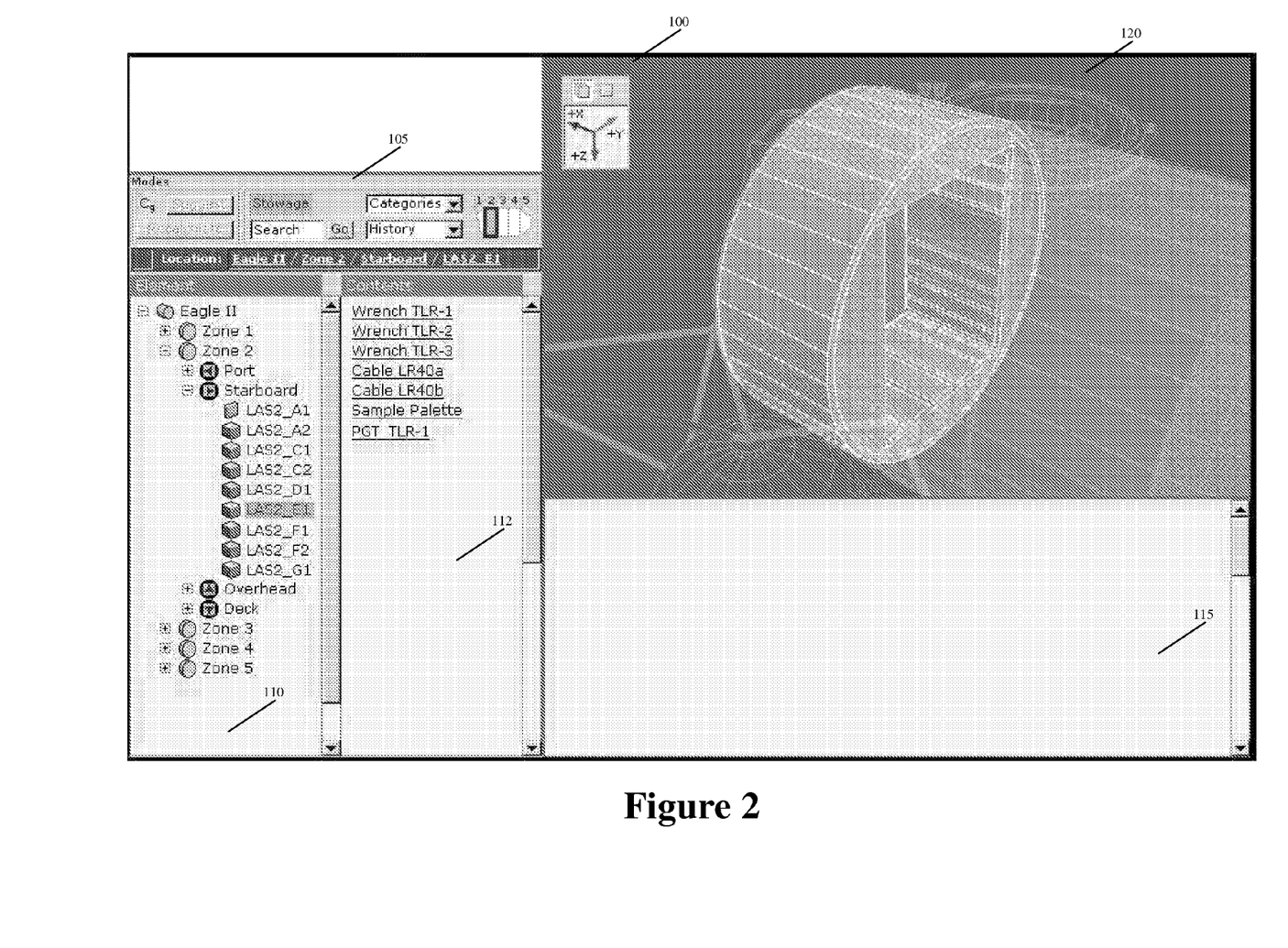
FIG. 2 is a screen capture of an exemplary user interface through which a user can identify a particular zone to be explored.

FIG. 2 is a screen capture of an exemplary user interface through which a user can identify a particular leaf or branch of zone 110 to be explored. In the embodiment illustrated in FIG. 2, the user has navigated to a particular storage module (LAS2_E1) on the Starboard size of Zone 2 of the environment. When the user selects LAS2_E1 from zone 110, a database associated with the stowage and center of gravity assessment tool is searched to determine which items are present in that storage module, and the corresponding list is displayed in contents 112. In the illustrated embodiment, environment view 120 changes such that the image "zooms in" on a representation of LAS2_E1 or another storage location when that storage location is selected from zone 110.

Figure 3:
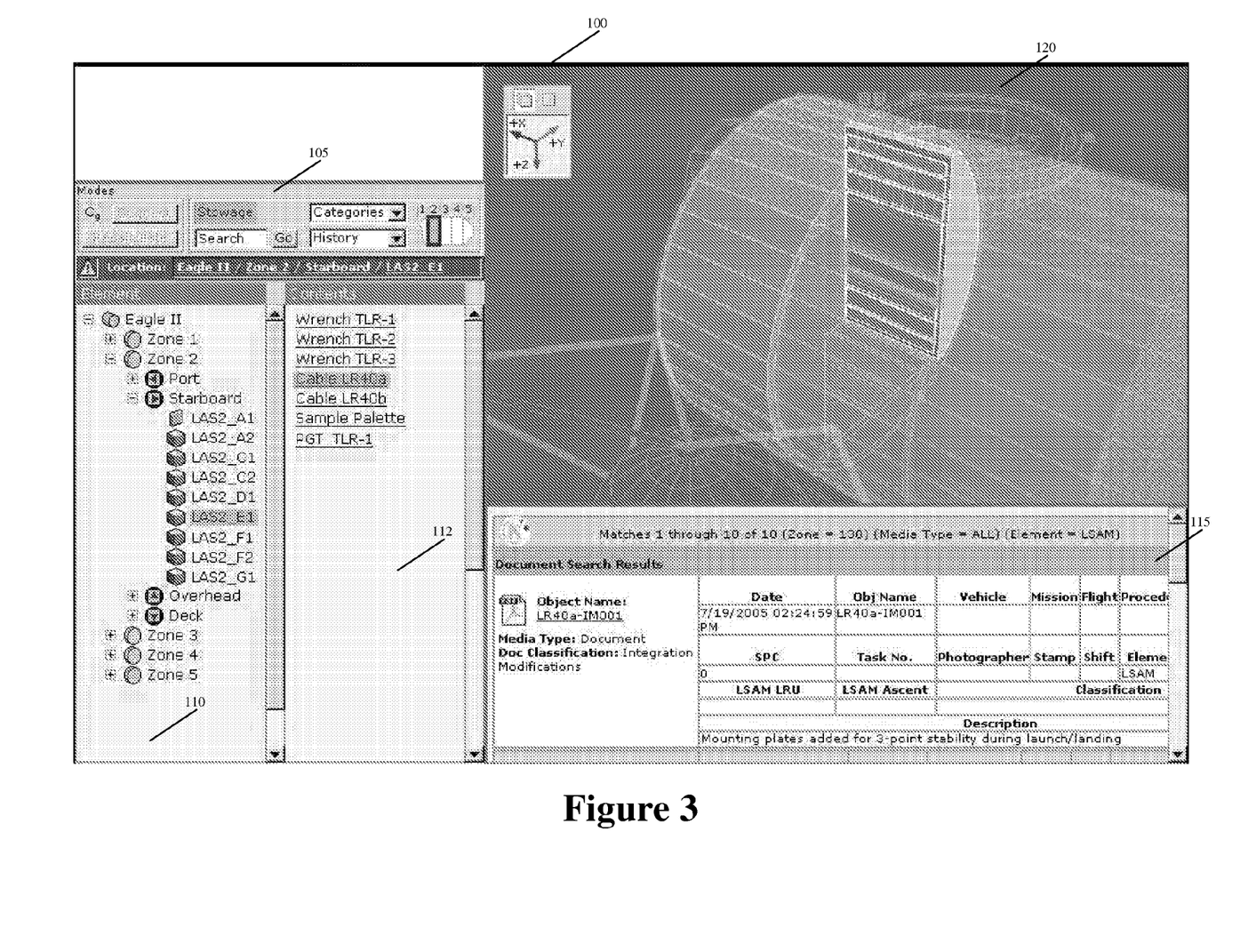
FIG. 3 is a screen capture of an exemplary user interface through which a user can view information about a particular item stored in the environment.

FIG. 3 is a screen capture of an exemplary user interface through which a user can view information about an item. In the embodiment illustrated in FIG. 3, the user has selected LAS2_E1 from the list of available zones in zone 110, and the item Cable LR40a from contents 112. In response to the selection of an item from contents 112, information pane 115 changes to provide information about the selected item. By way of example, without limitation, the information about the selected item may be obtained from an information management system such as that described in U.S. Pat. No. 11/466, 508, and may include a photograph of the selected item, usage instructions, troubleshooting and repair instructions, serial number, manufacture date, manufacturer, and other such information.

Figure 4:
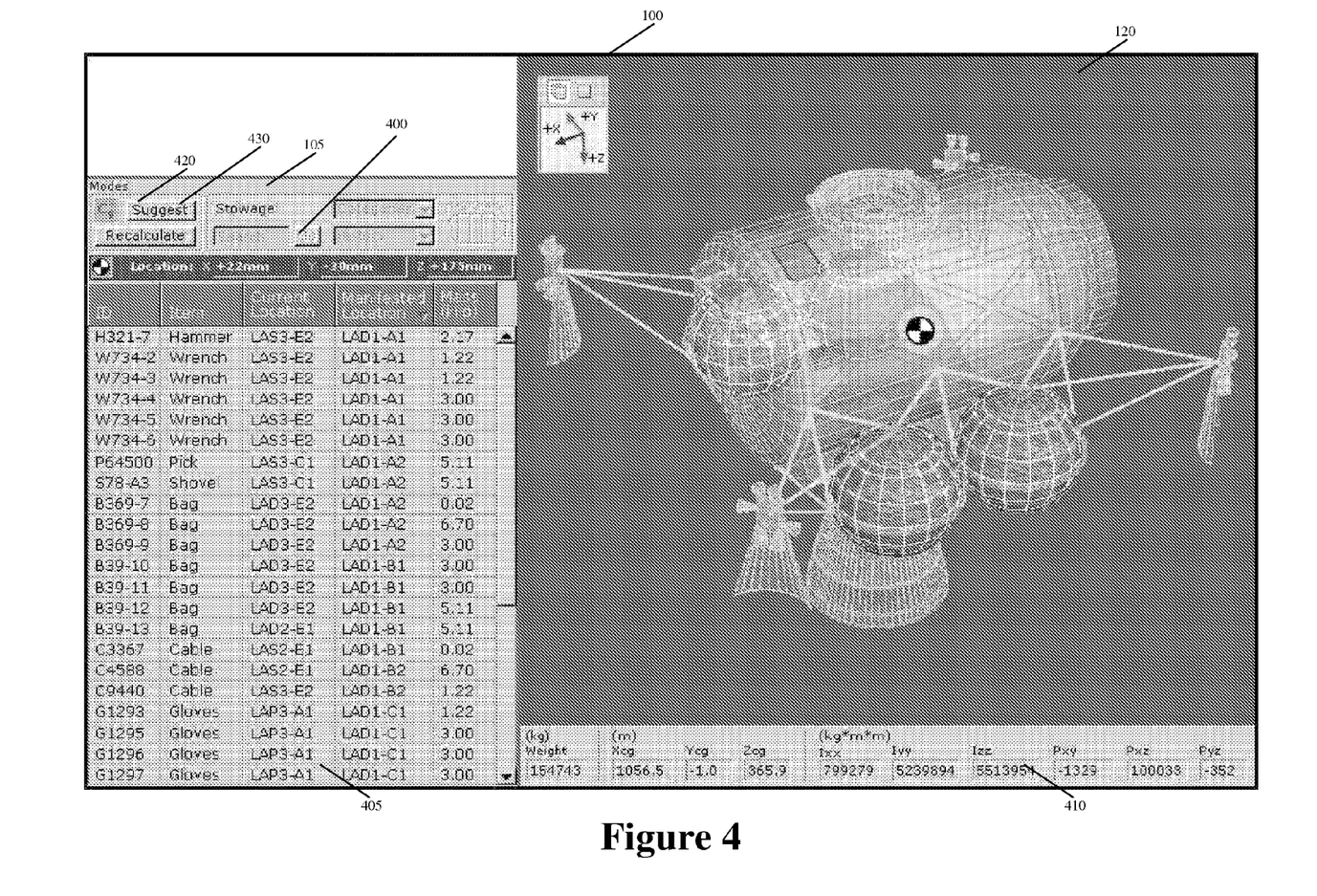
FIG. 4 is a screen capture of an exemplary user interface through which a user can review the center of gravity determination for the environment.

The item information location information as described above can be advantageous in a variety of scenarios, including, without limitation, when attempting to determine and/or alter the center of gravity of the environment. FIG. 4 is a screen capture of an exemplary user interface through which a user can review the center of gravity determination for the environment. In FIG. 4, center of gravity location 400 provides a precise determination of the difference between the ideal or desired center of gravity and the calculated center of gravity based on a variety of information about the environment. By way of example, without limitation, the calculation of the center of gravity may include, but is not limited to, the mass and location of each item in the environment; the amount of fuel, water, or other consumables remaining in their respective storage locations; and the like.

Item view 405 provides a detailed, orderable list of the items stored in the environment, and may include an identification number, a short description, a current location, the location where the item is supposed to be stored according to the manifest, and the mass of the item. When an item is selected in item view 405, location bar 400 can also provide location change information about that item relative to the desired center of gravity, such that moving the item by the specified distances, the environment's center of gravity can be brought closer to its desired location.

Environment information bar 410 provides an overview of the environment as a whole, including, without limitation, the environment's mass and center of gravity. In some embodiments, the center of gravity calculations are performed dynamically as items are moved within the environment. In some embodiments, the center of gravity calculations may be performed on a periodic basis. In some embodiments, the center of gravity calculations can be updated by the user, such as when the user clicks on or otherwise interacts with recalculate button 420.

In some embodiments, it may be desirable to move items within the environment to alter the center of gravity. By clicking on suggest button 420, the user can obtain a list of items, their current location, and a suggested new location which should help optimize the center of gravity location.

Figure 5:
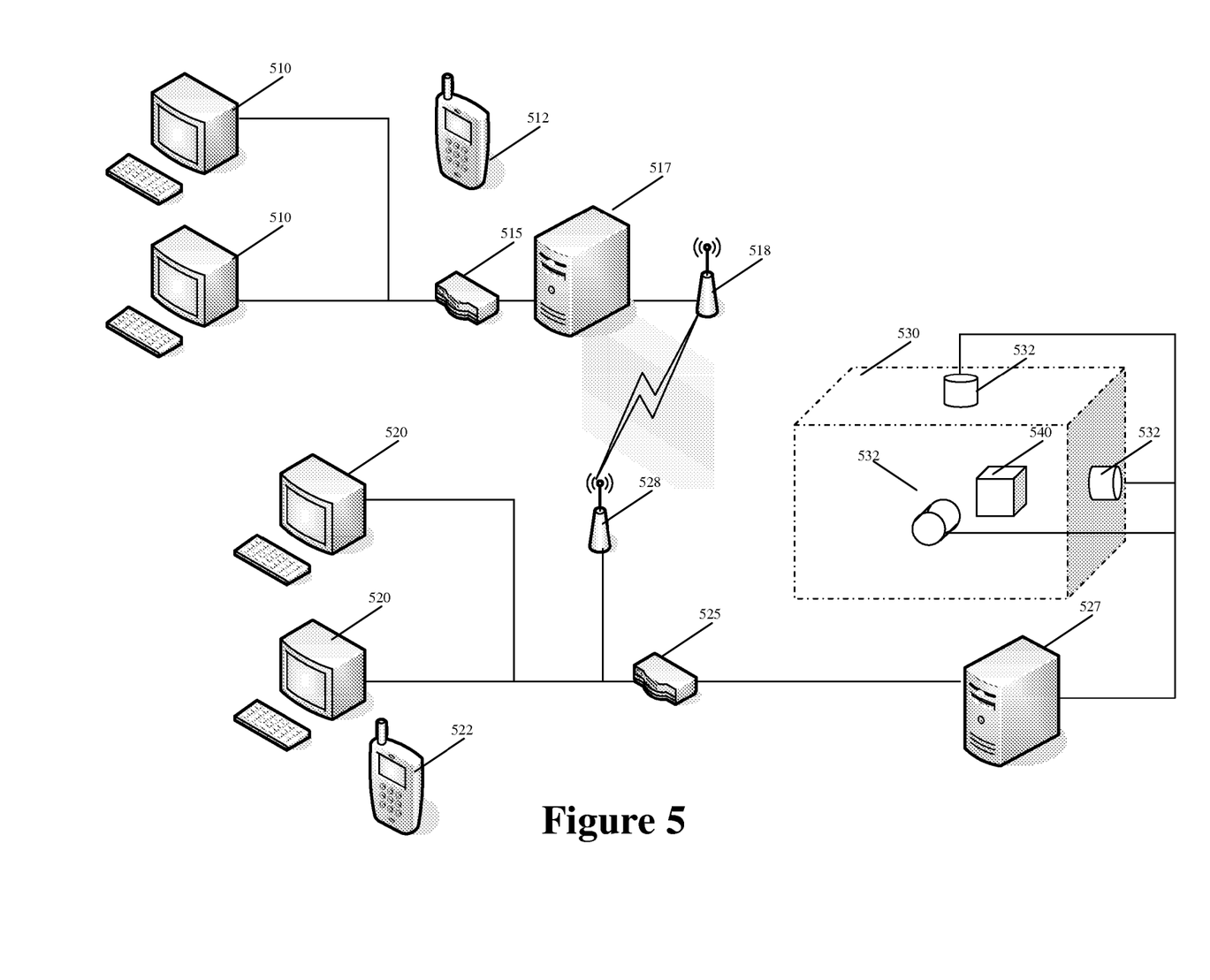
FIG. 5 is an exemplary network architecture supporting the instant stowage and center of gravity assessment tool.

FIG. 5 is an exemplary network architecture supporting the instant stowage and center of gravity assessment tool. In FIG. 5, a plurality of sensors 532 are deployed within or around environment 530. Sensors 532 periodically poll an identifier associated with item 540 to determine the location of item 540. The polling interval may be uniform for all items, or the polling interval may vary on an item-by-item basis, or based upon a classification associated with the item. By way of example, without limitation, in some embodiments each item may be assigned a poling interval based on the anticipated frequency with which the item will be moved. In such embodiments, the anticipated moving frequency may be determined in part based on a task schedule, such as that described in U.S. patent application Ser. No. 11/467,075, which is incorporated herein by reference in its entirety. In some embodiments, the polling interval may be dynamic, based on the actual frequency with which the item is moved. In some embodiments, the polling may be initiated in response to a user request.

In the embodiment illustrated in FIG. 5, server 527 can control item polling, calculate item locations based on such polling, store the item location information, and calculate the center of gravity for the environment. Although described herein as a single computing device, in alternative embodiments server 527 may comprise a plurality of computing and/or data storage devices. In addition, although server 527 is illustrated as external to environment 530, server 527 may be located within environment 530 without departing from the spirit or the scope of the invention.

In FIG. 5, router 525 allows a plurality of terminals 520 to access the item location information stored on server 527, to take advantage of server 527's center of gravity calculation capabilities, and the like. In some embodiments, server 527 may facilitate such access through a world wide web server incorporated therein.

Router 525, or another such device, may also facilitate remote access to server 527 via a wireless communications means, such as antenna 528. By way of example, without limitation, wireless device 522 can be moved throughout environment 530, thereby permitting the user of wireless device 522 to quickly obtain item information, and access the other features and functions associated with server 527. In some embodiments, wireless device 522, terminals 520, and router 525 may be located within environment 530. In some embodiments, wireless device 522 may be capable of independently polling an individual item, thereby allowing wireless device 522 to guide the user thereof to the individual item.

In addition to facilitating wireless communications with devices proximate to environment 530, antenna 528 or another, similar device may also facilitate communication with remote devices. By way of example, without limitation, where environment 530 is a Space Shuttle, antenna 528 may permit ground crews to access information stored on server 527 via antenna 518. In some embodiments, server 517 may automatically back up information from server 527 utilizing such a communications path, thereby providing redundancy in the event of a communications failure or other event. In FIG. 1, terminals 510 can access information stored in server 517 via router 515. Antenna 518, or a corresponding device, may also facilitate wireless access to server 517. By way of example, without limitation, ground crew members may be equipped with wireless device 512 and thereby access information stored on server 517 without needing to be proximate to one of terminals 510 or server 527.

Although FIG. 5 illustrates the architecture as utilizing servers 517 and 527, alternative embodiments may consolidate the features and functions associated with these servers into a single server.

In some embodiments, terminals 510 and 520, and wireless devices 512 and 522, may be relatively sophisticated computing devices capable of running stand-alone client applications. In some embodiments, terminals 510 and 520, and wireless devices 512 and 522, may be less sophisticated, with the devices and terminals providing an interface through which information may be accessed and provided, and with most of the computations performed by one or both of servers 517 and 527. By way of example, without limitation, due to power and other constraints within environment 530, terminals 520 may be capable of presenting a page from a conventional web browser and running applications written in the JAVA or JAVA Script languages. In such an exemplary embodiment, the terminals can display web pages generated by server 527, and/or modify the display based on information provided by server 527. By contrast, because terminals 510 may be located remotely from environment 530 and therefore not subject to the same restrictions as terminals 520, terminals 510 may be relatively sophisticated computing devices, such as workstations. Although terminals 510 may utilize the same application as terminals 520, terminals 510 may utilize applications developed in C, C++, Visual Basic, or other such language, and may be capable of more sophisticated calculations using data provided by server 517.

Figure 6:
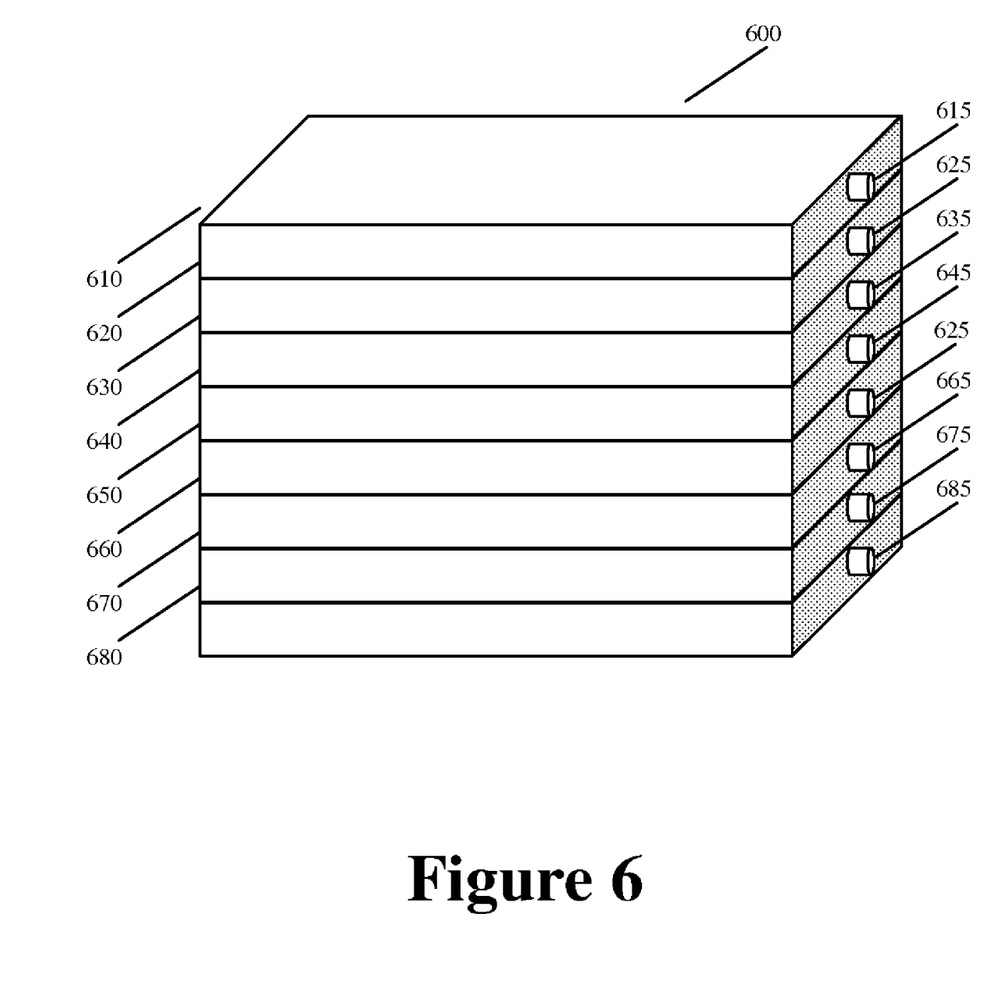
FIG. 6 is a perspective view of a drawer storage unit which has been equipped with sensors capable of polling the remotely pollable identifiers associated with items in the drawers.

FIG. 6 is a perspective view of drawer storage unit 600 which has been equipped with sensors capable of polling the remotely pollable identifiers associated with items in the drawers. In FIG. 6, each of drawers 610, 620, 630, 640, 650, 66, 670, and 680 is equipped with a respective sensor 615, 625, 635, 645, 655, 665, 675, and 685. Because the position of the sensors is known, the time delay between the receipt of an identification signal from an identifier associated with a polled item can be determined for each of the sensors, and thus the specific drawer in which the item is located can be determined.

In some embodiments, the item location information available via the storage and center of gravity assessment tool can also be utilized by the task scheduling and resource planning tool described in U.S. patent application Ser. No. 11,467,075 to better plan a day's activities. By way of example, without limitation, a user may be required to perform a task, and that task may require the use of a plurality of tools. Traditionally, the schedule for the day will allocate only a specific amount of time for the task, and assumes only a limited amount of time is needed to locate and collect the necessary tools. Using the location information available from the instant system, the scheduling application can determine a more accurate collection time for each task, thereby more accurately allocating time for both a specific task and any subsequent tasks that require the same item.

While detailed and specific embodiments of the stowage and center of gravity assessment tool have been described herein, it will be apparent to those skilled in the art that various changes and modifications can be made therein without departing from the spirit and scope of the stowage and center of gravity assessment tool. Thus, it is intended that the present disclosure cover these modifications and variations provided they come within the scope of any appended claims and/or their equivalents.

I claim:
1. An item monitoring system comprising:
 a plurality of items, each item having associated therewith at least one remotely pollable identification tag;
 a plurality of sensors employed within a confined environment to remotely read the pollable identification tags;
 a first computing device, the first computing device interfacing with the plurality of sensors to determine a location of at least a subset of the plurality of items; and
 a user interface, displayable by a second computing device, to provide a graphical representation of the environment and to allow a user to locate at least one of the plurality of items within the confined environment, wherein the first computing device interfaces with the plurality of sensors to determine the mass of at least a subset of the plurality of items, and wherein the first computing device determines the center of gravity for the environment, the center of gravity being determined, at least in part, based on the location and mass of each of the plurality of items in the environment.

2. The item monitoring system of claim 1, wherein the second computing device determines a new location for at least a subset of the plurality of items to optimize the center of gravity.

3. The item monitoring system of claim 1, wherein the confined environment further comprises consumables, and the first computing device determines the center of gravity for the environment, the center of gravity being determined, at least in part, based on the location and mass of each of the plurality of items in the environment, and, at least in part, by the amount of consumables remaining within the environment.

4. The item monitoring system of claim 3, wherein the consumables comprise fuel.

5. The item monitoring system of claim 3, wherein the consumables comprise water.

6. The item monitoring system of claim 3, wherein the second computing device determines a new location for at least a subset of the plurality of items to optimize the center of gravity.

7. The item monitoring system of claim 1, wherein the first computing device determining determines the location of at least a subset of the plurality of items according to a time delay between when a sensor attempts to read a pollable identification tag and when the sensor receives a response from the pollable identification tag.

8. The item monitoring system of claim 1, wherein the first computing device and the second computing device are the same.

9. The item monitoring system of claim 1, wherein the confined environment is an aerospace vehicle.

10. The item monitoring system of claim 1, wherein the confined environment is a nautical vessel.

11. A method to determine a center of gravity for a confined environment, comprising:

associating at least one remotely pollable identification tag with a plurality of items within a confined environment;

reading the at least one remotely pollable identification tags via a plurality of sensors disposed throughout the confined environment;

determining a location of at least a subset of the plurality of items via the plurality of sensors;

associating a mass with the at least a subset of the plurality of items; and determining a center of gravity for the confined environment, at least in part based on the location and mass of the plurality of items in the confined environment.

12. The method of claim 11, further comprising:

displaying the location of the at least a subset of the plurality of items via a user interface.

13. The method of claim 11, wherein the location of the at least a subset of the plurality of items is determined by a time delay between when a sensor attempts to read the at least one remotely pollable identification tag, and when the sensor receives a response from the at least one remotely pollable identification tag.

14. The method of claim 11, further comprising:

displaying the location of the at least a subset of the plurality of items via a user interface; and displaying a difference between the center of gravity of the confined environment and a desired center of gravity of the confined environment via the user interface.

15. The method of claim 14, further comprising displaying determined new locations for the at least a subset of the plurality of items to optimize the center of gravity via the user interface.

16. The method of claim 9, wherein the center of gravity is determined on a continual basis.

17. The method of claim 9, wherein the center of gravity being is determined on a periodic basis.

18. The method of claim 9, wherein:

the confined environment further comprises consumables, and the center of gravity is determined, at least in part, based on an amount of the consumables remaining within the confined environment.

19. The method of claim 18, further comprising displaying determined new locations for the at least a subset of the plurality of items to optimize the center of gravity via the user interface.

20. The method of claim 13, wherein the consumables comprise fuel.

21. The method of claim 13, wherein the consumable comprise water.

22. The method of claim 11, wherein the confined environment is an aerospace vehicle.

23. The method of claim 11, wherein the confined environment is a nautical vessel.

* * * * *